United States Patent [19]
Ishihara et al.

[11] Patent Number: 5,397,446
[45] Date of Patent: Mar. 14, 1995

[54] METHOD OF FORMING A FERROELECTRIC FILM

[75] Inventors: Kazuya Ishihara, Tenri; Shigeo Onishi, Nara, both of Japan

[73] Assignee: Sharp Kabushiki Kaisha, Osaka, Japan

[21] Appl. No.: 84,152

[22] Filed: Jul. 1, 1993

[30] Foreign Application Priority Data

Jul. 6, 1992 [JP] Japan .................................. 4-178325

[51] Int. Cl.$^6$ ............................................. C23C 14/34
[52] U.S. Cl. ..................... 204/192.18; 204/192.15; 204/192.2; 204/192.22; 204/192.26
[58] Field of Search ...................... 204/192.26, 192.18, 204/192.15, 192.2, 192.11, 192.17, 192.22, 192.29

[56] References Cited

U.S. PATENT DOCUMENTS

| | | | |
|---|---|---|---|
| 3,681,226 | 8/1972 | Vogel | 204/192.2 |
| 4,437,139 | 3/1984 | Howard | 204/192.15 |
| 4,911,809 | 3/1990 | Wort et al. | 204/192.12 |

FOREIGN PATENT DOCUMENTS 63-307606 12/1988 Japan .

*Primary Examiner*—R. Bruce Breneman
*Assistant Examiner*—Rodney G. McDonald
*Attorney, Agent, or Firm*—Nixon & Vanderhye

[57] ABSTRACT

A method of forming a ferroelectric film on a heated support is provided which includes the steps of forming a first layer on the heated support by sputtering a material including lead at a first pressure; and forming a second layer on the first layer by sputtering the material at a second pressure, the second pressure being lower than the first pressure.

13 Claims, 2 Drawing Sheets

METHOD OF FORMING A FERROELECTRIC FILM

BACKGROUND OF THE INVENTION

1. Field of the Invention

The present invention relates to a method of forming a ferroelectric film, and more specifically, a method of forming a ferroelectric film with a perovskite structure.

2. Description of the Related Art

Capacitors are used for accumulating charges in a semiconductor memory device. Such capacitors generally include two electrodes and an insulating film therebetween. The insulating film functions as a dielectric material to accumulate charge and is made of a material such as silicon nitride or silicon oxide. Recently, as semiconductor memory devices are more densely integrated, the area occupied by each of the capacitors must be made smaller. As is known, the capacitance of a capacitor is directly proportional to the overlap area of the two electrodes and is inversely proportional to the distance between the two electrodes. The overlap area is substantially the same as the area of the capacitor. Therefore, if the area of the capacitor is made smaller, the capacitance of the capacitor is smaller. As a result, there can arise a problem in that the capacitor can not accumulate enough charge for operating the semiconductor memory device correctly. An approach to solving such a problem is to reduce the distance between the two electrodes or to enlarge the overlap area of the two electrodes by forming the two electrodes with a complex cubic fin structure as is known.

The problem also can be solved by using a insulating film having a high dielectric constant. Metal oxide, such as lead zirconate titanate (hereinafter, referred to as "PZT"), which is denoted as a general formula of $ABO_3$ and has a perovskite structure is well known for use as a ferroelectric film having a high dielectric constant. The dielectric constant of a silicon oxide film is normally less than ten, but the dielectric constant of the ferroelectric film made of the PZT is more than one thousand. Therefore, in the case where the ferroelectric film is used as the insulating film of capacitors in a semiconductor memory device, the capacitor can have a large capacitance although the electrodes of the capacitor have a small overlap area and a simple structure.

A ferroelectric film can also have a characteristic in that a dielectric polarization of magnets within the ferroelectric film exhibits a hysteresis against an applied electric field. Therefore, after a voltage applied to the ferroelectric film is turned off, the ferroelectric film maintains the same dielectric polarization as the dielectric polarization caused by the applied voltage. A ferroelectric film having such a characteristic can be utilized in a non-volatile memory device, for example.

Hereinafter, a conventional method of forming a ferroelectric film using PZT will be described. A semiconductor substrate having an electrode of a metal such as a platinum formed thereon is heated at a temperature lower than 300 degree Celsius (°C.) during a deposition of the PZT film. While an argon and oxygen gas mixture flows into a reaction chamber, the PZT film is deposited on the electrode under reduced pressure by an RF sputtering method with a PZT sintered target having a molar composite ratio of Ti:Zr:Pb=0.5:0.5:1.15. The thickness of the deposited PZT film is in the range of 200 to 300 nanometers (nm). The PZT film deposited by the RF sputtering method consists of an amorphous film or microcrystals with a pyrochroite structure, and does not have ferroelectric properties such as described above. Then, the substrate is annealed at a temperature in a range of 550° to 700° C. for 30 to 60 minutes. Annealing the PZT film causes a phase transition of the PZT, and the PZT film turns into a ferroelectric film having a perovskite structure.

The above-described method requires annealing the PZT film after the PZT film is deposited. Such annealing causes vaporization of the lead from the PZT film because the lead has the highest vapor pressure of all elements constituting the PZT film. Therefore, the PZT film must contain a larger quantity of lead than ordinarily suitable for a perovskite structure to compensate for vaporization of the lead. Moreover, the vaporization of the lead causes the formation of pinholes in the PZT film. Also, the PZT film tends to crack because of an internal stress or the like derived from annealing the PZT.

On the other hand, in the case where a PZT film is deposited at a high temperature, it is difficult to obtain the PZT film with a perovskite structure. High temperature causes the vaporization of the lead on the metal electrode (such as platinum) and decreases an adhesion coefficient of the lead thereto. As a result, the lead is defective in the PZT film.

In view of the aforementioned shortcomings associated with conventional methods of forming a ferroelectric film, there is a need in the art for a method which produces a ferroelectric film having a uniform composition and perovskite structure.

SUMMARY OF THE INVENTION

The present invention provides a method of forming a ferroelectric film which includes the steps of forming a first layer on the heated support by sputtering a material including lead at a first pressure; and forming a second layer on the first layer by sputtering the material at a second pressure, the second pressure being lower than the first pressure.

Thus, the invention described herein makes possible the advantage of providing a method for forming a ferroelectric film having a uniform composition in a deposition direction with a perovskite structure.

This and other advantages of the present invention will become apparent to those skilled in the art upon reading and understanding the following detailed description with reference to the accompanying figures.

DESCRIPTION OF THE PREFERRED EMBODIMENTS

Figure 1:
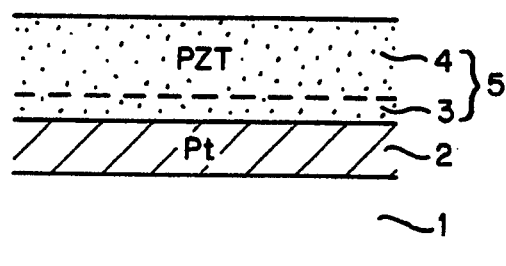
FIG. 1 is a schematic cross sectional view of a ferroelectric film formed according to a method of the present invention.

Referring to FIG. 1, a method of forming a ferroelectric film 5 of PZT by the present invention will be described.

As is shown in FIG. 1, an electrode 2 of platinum is deposited on a silicon substrate 1. The electrode 2 serves as a support. The thickness of the electrode 2 is selected to be about 300 nm. Other materials ordinarily utilized for a capacitor electrode can also be applied as the electrode 2 without departing from the scope of the invention. Moreover, the electrode 2 may have a thickness other than the thickness described above. The electrode 2 can be formed using an ordinary method employed in a semiconductor manufacturing process, for example, an evaporation method, a sputtering method, etc.

A ferroelectric film 5 which consists of an initial layer 3 and a PZT layer 4 will be formed on the electrode 2 with an RF magnetron sputtering apparatus using a sintered target. The sintered target consists of PZT having a molar composite ratio of Pb:Zr:Ti=1.0:0.5:0.5 and excess lead oxide by 50 mol %. Another sintered target, which consists of a PZT having a molar composite ratio of Pb:Zr:Ti=1.0:0.5 to 0.8:0.5 to 0.2 and excess lead oxide by 20 to 50 mol %, can also be utilized. The sputtering apparatus preferably includes means for heating the substrate 1 and electrode 2. It is preferable to heat the electrode 2 at a temperature in the range of 550° to 700° C., and more preferably, at 600° C. during formation of the ferroelectric film 5 in order that the ferroelectric film 5 has a polycrystalline structure. Also, the RF magnetron sputtering apparatus is supplied with an argon and oxygen gas mixture for discharging and maintaining an oxidizing atmosphere.

The initial layer 3 having a thickness of about 10 nm is formed on the electrode 2 under the following condition. A reaction pressure is controlled to be a pressure in the range of 50 to 100 mTorr, and more preferably about 100 mTorr while maintaining the flow ratio of Ar:$O_2$=8:2. While the mixed gas is discharged, an RF power density is set to be about 1 W/cm$^2$. The adhesion coefficient of lead to platinum is so small under a temperature such as 600° C. that lead is deficient in the PZT film formed at that temperature under ordinary conditions. As a result, the PZT film can not contain enough quantity of lead to have a perovskite structure and the PZT film has a pyrochroite structure. However, according to a method of the present invention, the initial layer 3 is formed at a higher pressure than that usually employed in a conventional method. Employing such a higher pressure reduces a vapor pressure of the lead in the initial layer 3 formed on the electrode 2 and increases the adhesion coefficient of lead to the electrode 2. Thus, the lead is not defective in the initial layer 3, and the initial layer 3 has the perovskite structure. It is preferable that the initial layer 3 has a thickness at which the initial layer 3 has a stable perovskite structure, and more specifically, a thickness in the range of 5 to 10 nm is preferred.

Next, the PZT layer 4 having thickness about 300 nm is formed on the initial layer 3 at a pressure in the range of 5 to 10 mTorr, and more preferably at 10 mTorr. The thickness of the PZT layer 4 can be adjusted to provide a desired capacitance, but the thickness of the PZT layer 4 is preferably within the range of 150 to 300 nm. The RF power density is maintained about 1 W/cm$^2$. The flow ratio of the gas mixture is preferably changed continuously or in discrete steps from Ar:$O_2$=8:2 to Ar:$O_2$=1:1 so that the obtained PZT layer 4 can have a good quality. Whereby, the ferroelectric film 5 consisting of the initial layer 3 and the PZT layer 4 are formed on the electrode 2.

In the method of the present invention, the lead is more easily oxidized as the oxygen increases in the gas mixture. Because the lead oxide has lower vapor pressure than the lead, the ferroelectric film 5 contains more quantity of the lead as the oxygen increases in the gas mixture. However, such an increase of the oxygen in the gas mixture has little effect on increasing the adhesion coefficient of the lead to the electrode 2. On the other hand, as is described above, an increase of total pressure of the gas mixture has much effect on the improvement of the adhesion of the lead to the electrode 2. Therefore, even if the gas mixture contains less oxygen, the adhesion coefficient of the lead to the electrode 2 can be increased by forming the initial layer 3 of the ferroelectric film 5 at a higher pressure as is mentioned above. Thus, the method of the present invention is not limited to the particular gas mixture ratio described above. A desired gas mixture ratio can be selected according to a material used for a ferroelectric film 5 as will be appreciated by those having ordinary skill in view of the present invention.

In general, a structure of a layer, which is initially formed during a deposition of a film, has strong effects on the total structure of the film. According to the method of the present invention, the initial layer 3 has the perovskite structure. The PZT layer 4 which is formed on the initial layer 3 is affected by the perovskite structure of the initial layer 3 and has the perovskite structure. Therefore, the complete ferroelectric film 5 has the perovskite structure.

Because the PZT layer 4 is formed at a low pressure, the PZT layer 4 is dense and has a good quality. Moreover, by being deposited at a lower pressure, a deposition rate of the PZT increases and the PZT layer 4 can be deposited in a moderate time. If the initial layer 3 is formed at such a low pressure, for the reason mentioned above, the initial layer 3 contains less quantity of the lead and can not have the desired perovskite structure.

The method of the present invention does not require an annealing step after deposition because the ferroelectric film 5 is formed using heating at high temperature. Therefore, pinholes are not formed in the ferroelectric film 5 and an uneven distribution of a composition in the ferroelectric film 5 is not caused. Moreover, the ferroelectric film 5 will not crack after formation thereof due to an internal stress derived from annealing.

Figure 2:
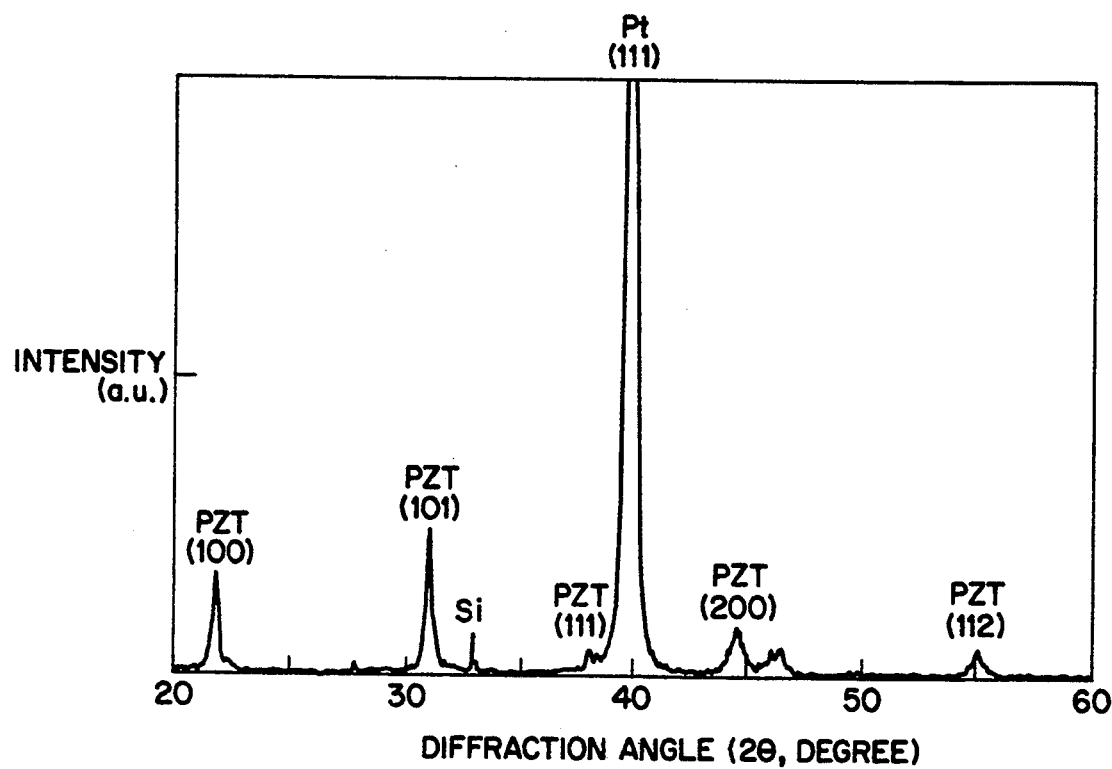
FIG. 2 is a chart which shows an X-ray diffraction spectra of the ferroelectric film formed according to a method of the present invention.
Figure 3:
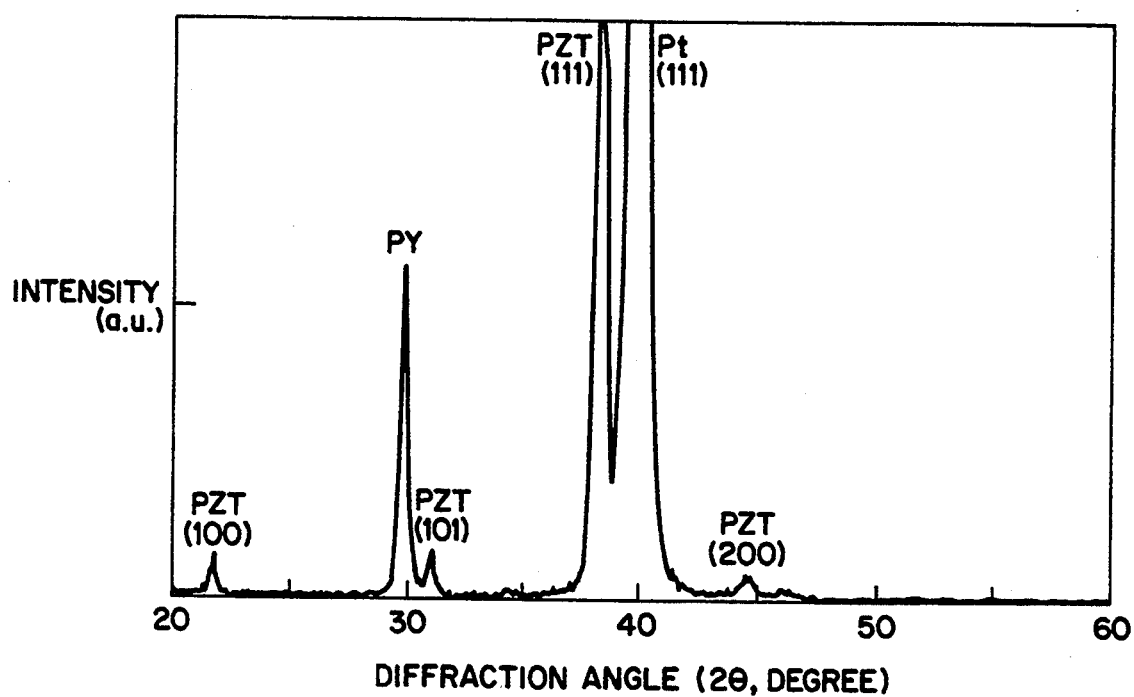
FIG. 3 is a chart which shows an X-ray diffraction spectra of the ferroelectric film formed by a conventional method.

For the purpose of demonstrating the effects of the present invention, the ferroelectric film 5 was analyzed by an X-ray diffraction method. FIG. 2 is a chart which shows an X-ray diffraction spectra of the ferroelectric film 5 formed by the method described above. For the purpose of comparing results, a chart which illustrates an X-ray diffraction spectra of a ferroelectric film formed by conventional method is shown in FIG. 3. The ferroelectric film represented in FIG. 3 does not include the initial layer 3 and was formed in its entirety under the condition in that the PZT layer 4 was formed. In FIGS. 2 and 3, the horizontal axis of each chart indicates the diffraction angle of the diffracted X-ray, and the vertical axis of each chart indicates the relative intensity of the diffracted X-ray.

As is shown in FIG. 2, some peaks are detected in the range of 20 to 60 degrees. All the peaks except the peaks respectively marked with "Si" and "Pt(111)" derive from the PZT having the perovskite structure. Accordingly, the ferroelectric film 5 by the method of the present invention consists of a polycrystal of the PZT in which each crystal has the perovskite structure and is arranged in random direction. On the other hand, as is shown in FIG. 3, there is a peak near 30 degrees. This peak derives from the pyrochroite structure. Therefore, the ferroelectric film formed without the initial layer 3 has a mixture of the perovskite structure and the pyrochroite structure.

In addition, the dielectric constants of the two ferroelectric films were measured. The dielectric constant of the ferroelectric film 5 formed by the method of the present invention was about 1000 and the dielectric constant of the ferroelectric film illustrated in FIG. 3 was about 500 to 600. The ferroelectric film 5 has a higher dielectric constant because the entire ferroelectric film 5 has uniformly the perovskite structure. These results agree with the results of the X-ray diffraction analysis described above.

In addition to the ferroelectric film 5 mentioned above, a ferroelectric film containing such as a lead lanthanum zirconate titanate can be formed by a method of the present invention. Specifically, a sintered target preferably consists of a lead lanthanum zirconate titanate having a molar composite ratio of Pb:La:Zr:Ti=1.0:0.5 to 0.8:0.5 to 0.2:0.5 to 0.2 and excess lead oxide by 20 to 50 mol %. Also, a metal target which does not contain metal oxide can be utilized. In the case where a sintered target is used for forming a ferroelectric film, it is preferable to employ an RF magnetron sputtering apparatus. A DC magnetron sputtering apparatus is suitable for forming a ferroelectric film using a metal target. According to the target and apparatus which are utilized, reaction gases are selected and flow ratio thereof are determined as is explained above.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of forming a ferroelectric film on a heated support comprising the steps of:
    forming a first layer on said heated support by sputtering a target of ferroelectric material including lead, the sputtering for forming the first layer being conducted at a first pressure; and
    forming a second layer on said first layer by sputtering said target of ferroelectric material, the sputtering for forming the second layer conducted at a second pressure, said second pressure being lower than said first pressure.

2. The method of claim 1, wherein said support is an electrode for a capacitor.

3. The method of claim 1, wherein said first layer and said second layer are substantially polycrystalline with a perovskite structure.

4. The method of claim 1, wherein said first pressure is in the range of 50 to 100 mTorr and said second pressure is in the range of 5 to 10 mTorr.

5. The method of claim 1, wherein said support is heated at a temperature in the range of 550° to 700° C.

6. The method of claim 1, wherein said ferroelectric material further includes zirconium and titanium.

7. A method of forming a ferroelectric film on a heated support comprising the steps of:
    forming a first layer having a perovskite structure on said heated support by sputtering a ferroelectric material including lead, said sputtering for forming said first layer being conducted at a first pressure, said heated support being maintained at a temperature which is sufficiently high in order that said first layer has a perovskite structure; and
    forming a second layer on said first layer by sputtering said ferroelectric material, said sputtering for forming said second layer being conducted at a second pressure, said second pressure being lower than said first pressure, said heated support being maintained at a temperature which is sufficiently high in order that said second layer has a polycrystalline structure.

8. The method of claim 7, wherein said first pressure is in the range of 50 to 100 mTorr and said second pressure is in the range of 5 to 10 mTorr.

9. The method of claim 8, wherein said support is maintained at a temperature in the range of 550° to 700° C. during the formation of both said first layer and said second layer.

10. The method of claim 7, wherein said sputtering for forming both said first layer and said second layer is conducted using an inert gas and an oxygen gas, and a flow ratio of said inert gas to said oxygen gas for forming said first layer is greater than that for forming said second layer.

11. The method of claim 10, wherein said flow ratio of said inert gas to said oxygen gas for forming said first layer is approximately 8:2.

12. A method of forming a ferroelectric film on a heated support comprising the step of forming a ferroelectric film having a perovskite structure on said heated support by sputtering a ferroelectric material containing lead, said heated support being maintained at a temperature which is sufficiently high in order that said ferroelectric film has a perovskite structure, wherein said sputtering is initially conducted at a first pressure and subsequently conducted at a second pressure to increase a deposition rate of said ferroelectric film, the first pressure being greater than the second pressure.

13. The method of claim 12, wherein said first pressure is in the range of 50 to 100 mTorr and said second pressure is in the range of 5 to 10 mTorr.

* * * * *